United States Patent [19]
Tanimoto

[11] Patent Number: 5,250,116
[45] Date of Patent: Oct. 5, 1993

[54] RESIST FILM COATING APPARATUS

[75] Inventor: Keisuke Tanimoto, Ikoma, Japan

[73] Assignee: Sharp Kabushiki Kaisha, Osaka, Japan

[21] Appl. No.: 885,376

[22] Filed: May 19, 1992

[30] Foreign Application Priority Data

May 24, 1991 [JP] Japan .................. 119817

[51] Int. Cl.⁵ .................. B05C 11/02; B05C 5/00
[52] U.S. Cl. .................. 118/664; 118/712; 118/52; 118/56; 118/320; 427/9; 427/10
[58] Field of Search .................. 118/664, 712, 52, 56, 118/320; 427/9, 10

[56] References Cited

U.S. PATENT DOCUMENTS

| 3,689,747 | 9/1972 | DiMillia et al. | 118/644 |
| 3,747,558 | 7/1973 | Harel | 118/644 |
| 4,702,931 | 10/1987 | Falcoff | 427/10 |
| 4,843,874 | 7/1989 | Tsuyoshi et al. | 427/10 |

FOREIGN PATENT DOCUMENTS

| 48-17153 | 5/1973 | Japan | 118/664 |
| 58-82521 | 5/1983 | Japan | 118/52 |
| 4-94525 | 3/1992 | Japan | 118/52 |
| 4-195744 | 7/1992 | Japan | 118/52 |
| 2000882 | 1/1979 | United Kingdom | 118/664 |

Primary Examiner—Jones W. Gary
Assistant Examiner—Todd J. Burns
Attorney, Agent, or Firm—Nixon & Vanderhye

[57] ABSTRACT

A resist film coating apparatus comprises a resist receiving plate secured to a rotatable support plate carrying a wafer so as to be disposed along the outer periphery of the wafer, an interference type film thickness meter for measuring the thickness of a resist film spun out to the resist receiving plate, and modifying means for changing the revolution number of the support plate on the basis of a result of measurement by the film thickness meter such that a desired resist film thickness can be obtained.

2 Claims, 3 Drawing Sheets

RESIST FILM COATING APPARATUS

BACKGROUND OF THE INVENTION (i) Field of the Invention

The present invention relates to resist film coating apparatus and more particularly to a resist film coating apparatus which is improved to permit formation of a uniform resist film on a wafer used for an integrated circuit and the like.

(ii) Prior Art

Recently, with high degree of integration of integrated circuits encouraged, fine formation of a pattern formed on a wafer has further been promoted and high dimensional accuracies have been required. Accordingly, the role of lithography techniques considered to be in the heart of the fine formation of patterns has added to its importance more and more. Namely requirements imposed on exposure techniques and resist formation process as well as apparatus used therefor have become more stringent and have been diversified.

A conventional resist film coating apparatus used for formation process of a resist film on a wafer employs a spin coat method in which resist liquid is dropped on the central part of the wafer and the wafer is rotated at a constant revolution number to shake off the resist dropped on the wafer, thus forming a resist film of a desired thickness.

In the conventionally available spin coat method for resist film formation, however, the thickness of a resist film to be coated is not monitored constantly but is monitored at intervals during spin coating. This leads to a disadvantage that the resist film thickness sometimes deviates from an intended value to prevent formation of a pattern of an intended line width.

In connection with measurement of the thickness of resist films, on the other hand, an invention concerning a similar technique to the resist film coating apparatus and entitled "Substrate Processing Apparatus" is disclosed in Japanese Patent Application Laid-open No. Hei 1-276722, laid open on Nov. 7, 1989.

Described therein is a substrate processing apparatus in which a resist film is coated on a wafer by using the aforementioned spin coat method and a resist pattern obtained by selectively exposing the resist film is developed.

More particularly, the described substrate processing apparatus is as shown in FIG. 1 and it comprises a spin drive 2 for fixedly carrying a wafer 1 formed at its surface with a film and rotating the film at a high speed, a cup 3 for covering the spin drive 2 and wafer 1 and a liquid chemical nozzle 5 reciprocative radially of the wafer 1. This Japanese Patent Application Laid-open No. Hei 1-276722 also describes that the substrate processing apparatus further comprises a position detector 8 for measuring the distance of the liquid chemical nozzle 5 in motion from the center of the wafer 1, a plurality of film thickness measuring elements 9, 10 and 11 arranged above the wafer 1 radially thereof and an operation/control unit 12 operative to control the discharge amount of liquid chemicals, the reciprocating speed of the liquid chemical nozzle 5 and the revolution number of the wafer on the basis of measurement results delivered out of the film thickness measuring elements 9, 10 and 11, whereby the progress state of development affected by irregularities in the thickness of a coated film on the wafer 1 and in the exposure amount is monitored by the plurality of film thickness measuring elements 9, 10 and 11 arranged radially, differences in developing rate over the wafer surface are measured by means of the plurality of film thickness measuring elements, and results of measurement are fed back to control the discharge amount of liquid chemicals, the reciprocating speed of the liquid chemical nozzle and the revolution number of the wafer, thereby ensuring that defective due to irregularities in pattern dimension over the entire surface of the wafer can be eliminated.

However, the invention described in the aforementioned Japanese Patent Application Laid-open No. Hei 1-276722 is directed to measurement of a film thickness on an actual wafer and has difficulties in being applied to all the processes of production of an actual device. For example, when a substrate having a silicon oxide film and a silicon nitride film which underlie a resist is measured with a film thickness meter of interference type, thicknesses of the underlying transparent films are inevitably included in the results of measurement.

SUMMARY OF THE INVENTION

Accordingly, a main object of the invention is to provide a resist film coating apparatus which can perform coating while monitoring the thickness of a resist film formed on a wafer and can provide a desired uniform thickness of the resist film formed on the wafer on the basis of results of monitoring.

According to the invention, to accomplish the above object, in a resist film coating apparatus in which a support plate carrying a wafer is rotated at a predetermined revolution number, a resist receiving plate is arranged along the outer periphery of the support plate, film thickness measuring means is provided which measures a resist film spun out from the wafer carried on The support plate to the resist receiving plate and modifying means is provided which calculates a necessary revolution number of the support plate to provide a predetermined resist film thickness on the basis of a result of measurement of the thickness of the resist film and changes the predetermined revolution number of the support plate such that the revolution number of the support plate coincides with a result of calculation.

DESCRIPTION OF THE PREFERRED EMBODIMENTS

Figure 1:
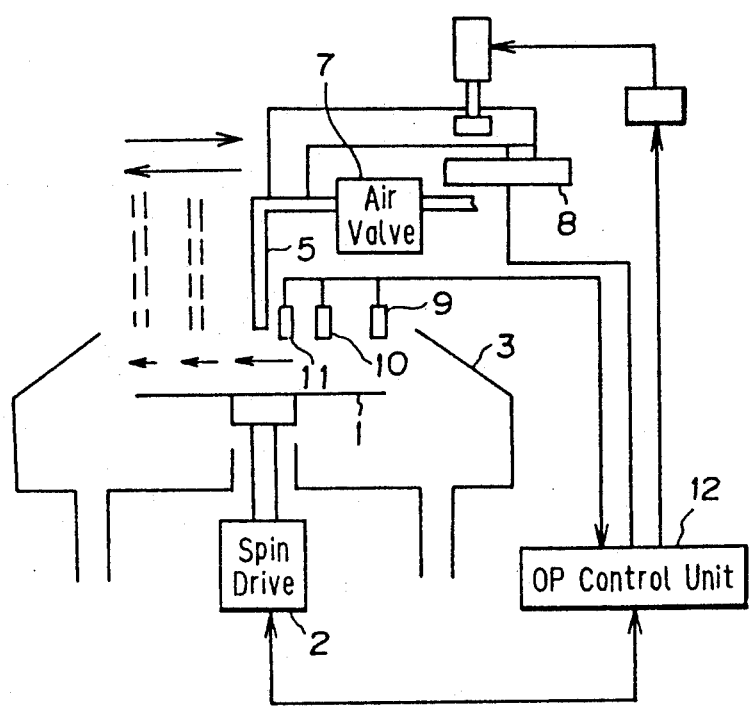
FIG. 1 is a longitudinal sectional view showing the schematic construction of a prior art spin developing apparatus for a resist pattern on a wafer.
Figure 2:
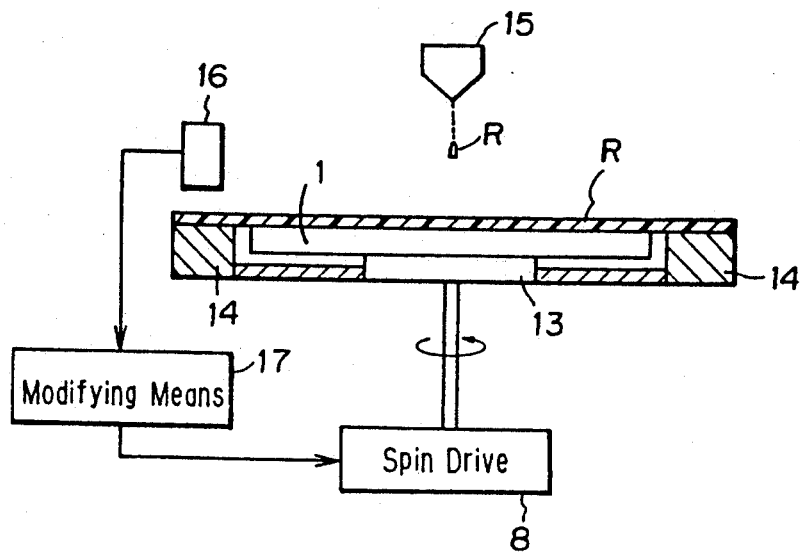
FIG. 2 is a longitudinal sectional view showing the schematic construction of a resist film coating apparatus according to an embodiment of the invention.

To describe the construction of the invention in greater detail, a resist film coating apparatus of the invention has as shown in FIG. 2 a support plate 13 carrying a wafer 1 and rotatably arranged, a resist receiving plate 14 arranged along the outer periphery of the support plate 13, a resist feeder 15 for supplying resist R onto the wafer 1 and a spin drive 8 for rotating the support plate 13 at a predetermined revolution number, wherein the resist receiving plate 14 is secured to the support plate 13 so as to be disposed along the outer periphery of the wafer 1 and there are provided measuring means 16 for measuring the film thickness of resist spun out from the wafer to the resist receiving plate and modifying means 17 for calculating a necessary revolution number of the support plate to provide a predetermined film thickness on the basis of a result of the resist film thickness measuring by the measuring means 16 and changing the predetermined revolution number of the spin drive 8 such that the revolution number of the support plate coincides with a result of calculation.

Further, in the resist film coating apparatus of the invention, by using a plate having a reflective surface as the resist receiving plate and a film thickness meter of interference type as the film thickness measuring means 16, the thickness of a resist film formed even on a wafer which has experienced various processes to have, for example, an impurity concentration distribution having an excessive gradient or a multi-layer film can be measured easily.

Figure 3:
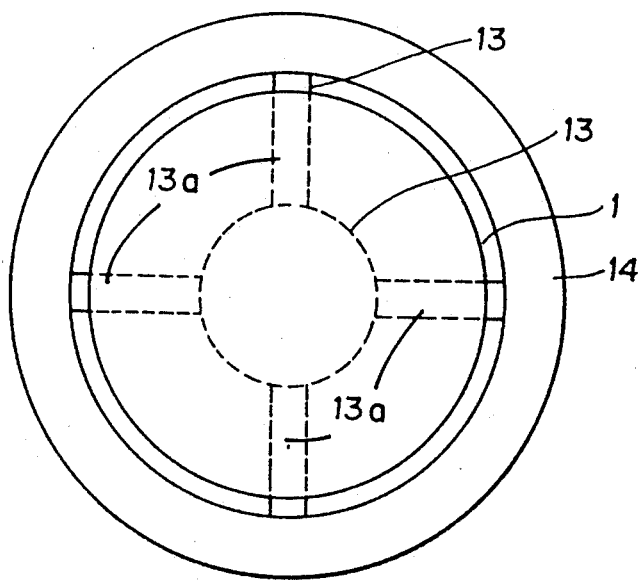
FIG. 3 is a plan view showing the essential part of the resist film coating apparatus shown in FIG. 2.

FIG. 2 shows an embodiment of construction of the resist film coating apparatus according to the invention and FIG. 3 is a plan view thereof. An embodiment of the invention will now be described with reference to these Figures.

The support plate 13 carrying a wafer 1 is supported on a rotary shaft 18. A metal plate serving as resist receiving plate 14 arranged along the outer periphery of the wafer 1 is securely connected, as shown in FIG. 3, to metal arms 13a radially extending from the wafer support plate 13. The distance between the wafer 1 and metal plate 14 is about 1 mm, the width of the metal plate 14 is about 20 mm and the surface of the wafer 1 carried on the support plate 13 is flush with the top surface of the metal plate 14. Arranged above the wafer 1 is the resist feeder 15 which is so positioned as to drop resist R onto the central part of the wafer 1. The film thickness meter 16 of interference type is disposed at a predetermined site to measure the thickness of a film of resist R. The modifying means 17 is provided which calculates a revolution number of the wafer support plate 13 on the basis of a result of measurement by the film thickness meter 16 of interference type and modifies the predetermined revolution number of the wafer support plate 13 to a calculated value.

Operation of the resist film coating apparatus having the above construction will now be described.

After resist R is dropped onto the center of the wafer 1, the wafer 1 is rotated at a predetermined revolution number at which a desired film thickness can be obtained. Thereafter, the rotation is stopped temporarily and a film thickness on the metal plate 14 is measured by means of the film thickness meter 16 of interference type.

Subsequently, the procedure proceeds to a step of coating a resist film on the next wafer (not shown). Prior to this step, the wafer 1 carried on the support plate 1 and the resist R on the metal plate 14 have to be removed at a time. To this end, while keeping the support plate 13 rotating at a predetermined revolution number, a resist dissolvent (hereinafter abbreviated as a rinse liquid) such as ethyl cellsolve acetate (ECA) or acetone is dropped from a nozzle (not shown) disposed above the edge of the wafer 1 to remove resist R on the edge of the wafer 1 and on the metal plate 14 and subsequently dropping of the rinse liquid is stopped. Thereafter, the wafer support plate 13 is rotated at a predetermined revolution number to remove resist R from a predetermined part and the wafer 1 carrying the remaining resist is dried.

According to the resist film coating apparatus of the present embodiment, since resist R is coated on the top surface of the metal plate 14 arranged along the outer periphery of the wafer 1 and on the wafer 1 to the same thickness, the film thickness of resist R on the wafer 1 can be determined by measuring the film thickness of resist R on the metal plate 14.

Figure 4:
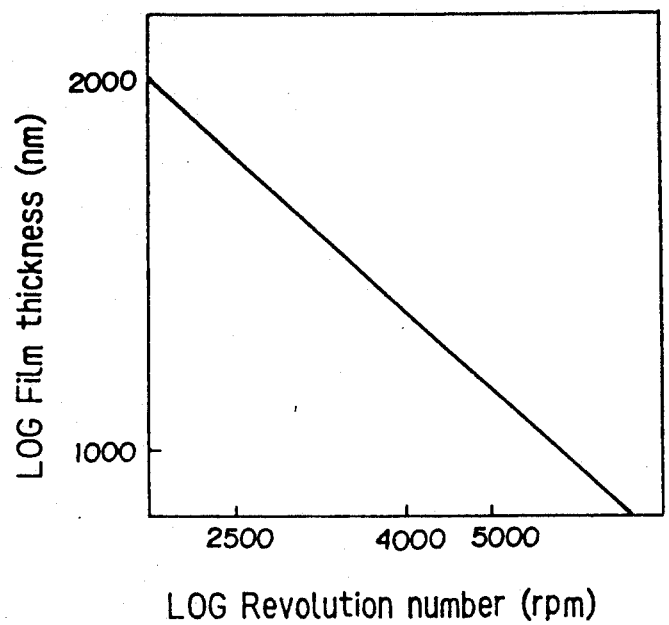
FIG. 4 is a graph showing the relation between the film thickness (mm) of a resist film prepared with the resist film coating apparatus of the embodiment of the invention and the revolution number.

Depending on the kind of resist used, the correlation between the film thickness of coated resist R and the revolution number during coating of resist R differs. For example, when resist of AZ1470 produced by SHIPLEY COMPANY INK.S is used, the correlation between resist film thickness (T) and revolution number (R) upon resist coating is indicated as shown in a graph of FIG. 4 having abscissa and ordinate both in logarithmic scale.

The above correlation can be expressed by the following equation (1):

$$T = 2.24 \times 10^5 \times R^{-0.62} \tag{1}$$

Through the use of this graph, a revolution number for a desired film thickness can be obtained.

The revolution number for obtaining the aforementioned desired film thickness can have a highly accurate value through correction of revolution number to be described below.

Figure 5:
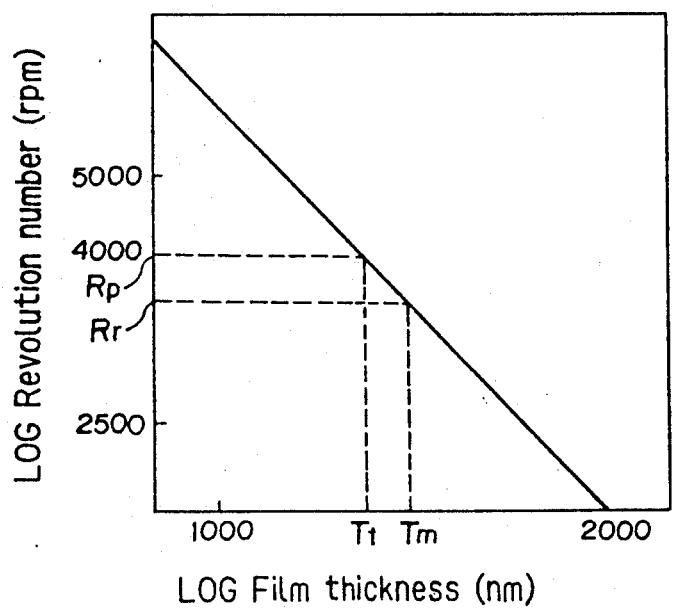
FIG. 5 is a graph showing the relation between the revolution number and resist film thickness on the wafer obtained with the resist film coating apparatus of the invention.

More particularly, the correlation between revolution number (R) upon resist coating and resist film thickness (T) is indicated pursuant to the following equation (2), as shown in a graph of FIG. 5 having abscissa and ordinate both in logarithmic scale:

$$R = 4.27 \times 10^8 \times T^{-1.61} \tag{2}$$

In FIG. 5, $I_t$ represents a target value of film thickness intended to be obtained and $R_p$ represents a predictive revolution number which can be obtained from the graph of FIG. 5 or equation (2). Represented by $T_m$ is a resist film thickness as obtained on the basis of a precedently set revolution number ($R_s$) and by $R_r$ is a corresponding revolution number as obtained from equation (2). Then, a correcting revolution number $R_t$ used upon the succeeding coating of resist onto the wafer is given by the following equation (3):

$$R_t = R_s + (R_p - R_r) \tag{3}$$

As will be seen from the above, by rotating the wafer 1 at the aforementioned corrected revolution number following dropping of resist R onto the wafer 1, the desired film thickness can be obtained.

The film thickness measurement and revolution number correction based on measurement results set forth so far can be carried out automatically.

While the present embodiment has been described as exemplarily using the metal plate as the resist receiving plate 14 and the interference type film thickness meter as the film thickness measuring means 16, the present invention is not limited thereto and a method may be employed in which an ordinary plate having at the top a reflective surface or a non-reflective surface is arranged and a resist film spun out from the wafer is measured with a different type film thickness meter.

According to the resist film coating apparatus of the invention, since the resist receiving plate is arranged along the outer periphery of a water and the thickness of a resist film spun out to the resist receiving plate is measured to determine the thickness of a resist film on the wafer, the thickness of the resist film coated on the wafer can be measured even when the wafer has experienced various processes. Further, the resist film coated on the metal plate can be removed simultaneously with removal of resist from the edge of the wafer and therefore repetitive measurement can be ensured and the film thickness measurement can be carried out constantly.

In addition, by providing the correction means in order to obtain a desired resist film thickness on the basis of the measurement results, the desired resist film thickness can be obtained with high accuracy and hence highly accurate line width control can be ensured.

Moreover, when the interference type film thickness meter of simple construction is used as the measuring means, the apparatus as a whole can be easy to handle.

I claim:

1. A resist film coating apparatus having a rotatable support plate carrying a wafer, a resist receiving plate arranged along the outer periphery of said support plate, a resist feeder for supplying resist onto the wafer carried on said support plate and a spin drive for rotating said support plate at a predetermined revolution number,
   wherein said resist receiving plate is secured to said support plate so as to be disposed along the outer periphery of said wafer,
   and further said apparatus comprising measuring means for measuring the film thickness of resist spun out from said wafer to said resist receiving plate, and modifying means for calculating a necessary revolution number of said support plate to provide a predetermined film thickness on the basis of a result of the resist film thickness measurement by said measuring means and changing the predetermined revolution number of said spin drive such that the revolution number of said support plate coincides with a result of calculation.

2. A resist film coating apparatus according to claim 1 wherein a plate having at its top a reflective surface is used as said resist receiving plate and an interference type film thickness meter is used as said film thickness measuring means.

* * * * *